United States Patent [19]
Thornburg et al.

[11] 3,906,537
[45] Sept. 16, 1975

[54] SOLID STATE ELEMENT COMPRISING SEMI-CONDUCTIVE GLASS COMPOSITION EXHIBITING NEGATIVE INCREMENTAL RESISTANCE AND THRESHOLD SWITCHING

[75] Inventors: David D. Thornburg, Los Altos; Richard I. Johnson, Menlo Park, both of Calif.

[73] Assignee: Xerox Corporation, Stamford, Conn.

[22] Filed: Nov. 2, 1973

[21] Appl. No.: 412,211

[52] U.S. Cl. .......................... 357/2; 357/61; 357/68
[51] Int. Cl.$^2$ .................... H01L 27/24; H01L 45/00
[58] Field of Search ........ 317/234 V, 234 N; 357/2, 357/68

[56] References Cited

UNITED STATES PATENTS

| | | | |
|---|---|---|---|
| 3,271,591 | 9/1966 | Ovshinsky | 317/234 V |
| 3,401,318 | 9/1968 | Jensen | 317/234 V |
| 3,418,619 | 12/1968 | Lighty | 317/234 V |
| 3,448,425 | 6/1969 | Shanefield et al. | 357/2 |
| 3,469,154 | 9/1969 | Scholer | 317/234 V |
| 3,619,732 | 11/1971 | Neale | 317/234 V |
| 3,629,155 | 12/1971 | Kristensen | 317/234 V |
| 3,657,006 | 4/1972 | Fisher et al. | 317/234 V |
| 3,675,090 | 7/1972 | Neale | 317/234 V |
| 3,820,150 | 6/1974 | Nicolaides | 357/2 |

OTHER PUBLICATIONS

Rockstad, "Amplification in an Amorphous...," J. Appl. Phys., Vol. 43, No. 1, Jan. 1972, p. 238.

*Primary Examiner*—William D. Larkins
*Attorney, Agent, or Firm*—James J. Ralabate; Terry J. Anderson; Leonard Zalman

[57] ABSTRACT

Semiconductor devices are provided which exhibit negative differential resistance depending upon their geometries. These devices are comprised of a semiconductive glass in contact with at least two spaced electrodes. If the glass is co-extensive in boundary with the electrodes at the points of contact, then current controlled negative differential resistance behavior will be exhibited. However, if the glass extends beyond the boundary defined by a contact surface with one of the electrodes, threshold switching may be attained instead. By merely modifying the geometry of a given semiconductor device of this type, one may select the mode of operation intended for the device.

9 Claims, 8 Drawing Figures

CURRENT CONTROLLED NEGATIVE DIFFERENTIAL RESISTANCE

THRESHOLD SWITCHING

SOLID STATE ELEMENT COMPRISING SEMI-CONDUCTIVE GLASS COMPOSITION EXHIBITING NEGATIVE INCREMENTAL RESISTANCE AND THRESHOLD SWITCHING

BACKGROUND OF THE INVENTION

This invention relates in general to solid state devices and more particularly to solid state devices comprising semiconductive glass compositions.

Recently, semiconducting devices have been developed which are made from solid substances that are glassy rather than crystalline which nevertheless may be employed to control the flow of electric current. An important example of such a device is the Ovonic switch developed by Stanford R. Ovshinsky. His switch is a threshold device comprising a two-terminal component which may have two states in an electrical circuit, namely, an almost non-conducting state and a conducting state. The device is usually in the nearly non-conducting state, i.e., off; but when the voltage across the device reaches a certain threshold value, it goes to the conducting state, i.e., switches on. On the removal of the applied voltage, the off state is immediately restored.

Among the many types of non-crystalline materials which are being investigated for such devices are amorphous oxides (including oxides of the vanadium, tungsten, phosphorous, germanium and silicon) and chalcogenide glasses, which may be regarded as inorganic polymers. The term chalcogenic is applied to any of the elements in Group VI*a* of the periodic table: oxygen, sulphur, selenium, and tellurium. The chalcogenide glasses include binary systems (for example, germanium-tellurium), ternary systems (various three-component mixtures of germanium, arsenic, tellurium, silicon, selenium, zinc, and cadmium) and quarternary systems composed of the same elements.

Semiconducting glasses of specific compositions have been shown by Shanefield in U.S. Pat. No. 3,448,425 to exhibit current controlled negative differential resistance (CNDR).

The present invention is based on the discovery that either CNDR or TS behavior may be obtained by changing merely the geometry of a device made of semiconducting glasses, independent of its particular composition.

It is an object of the present invention to provide an amorphous semiconducting device of a given chemical composition exhibiting either current controlled negative differential resistance or threshold switching behavior depending upon its geometry.

It is yet another object of the present invention to provide negative resistance devices using amorphous semiconducting materials previously used for threshold switching.

It is still another object of the present invention to provide threshold switching of solid state elements comprised of semiconductive glass compositions which heretofore exhibited only negative differential resistance behavior.

Other objects of the invention will be evident from the description hereinafter presented.

SUMMARY OF THE INVENTION

The invention provides amorphous semiconducting devices which may exhibit either current controlled negative differential resistance or threshold switching behavior depending upon their geometries, independent of their particular chemical compositions. More specifically, the present invention teaches that either current controlled negative differential resistance or threshold switching behavior can be observed for a given chalcogenide glass, depending upon the configuration of the device which embodies it. These devices are comprised of the semiconductive glass in contact with at least two spaced electrodes.

Another feature of the invention is that if the glass is co-extensive with the boundary defined by the contact loci between the glass and the electrodes, the current controlled negative differential resistance behavior will be exhibited. However, if the glass extends beyond the contact surface established with one of the electrodes, threshold switching may be attained. By modifying the geometry of such an amorphous semiconductor having a given chemical composition, one may choose the mode of operation intended for the device.

These and other features which are considered to be characteristic to this invention are set with particularity in the appended claims. The invention itself, as well as additional objects and advantages thereof, will best be understood from the following description when considered in conjunction with the accompanying drawings.

BRIEF DESCRIPTION OF THE DRAWINGS

FIG. 2(*b*) is a graphical representation of threshold switching behavior exhibited by an amorphous semiconductor device;

DESCRIPTION OF THE PREFERRED EMBODIMENT

Figure 1:
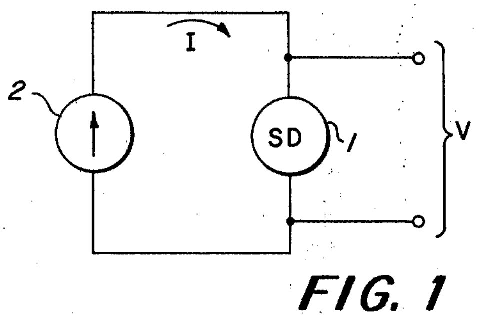
FIG. 1 is a schematic circuit for biasing a device of the present invention.

In FIG. 1 is shown a schematic circuit for biasing a two-terminal semiconductor device 1. The semiconductor device 1 is biased by a variable current source 2. The voltage V across the device 1 will vary with the current I depending upon the geometry as well as the chemical composition of the device 1.

Figure 2A:
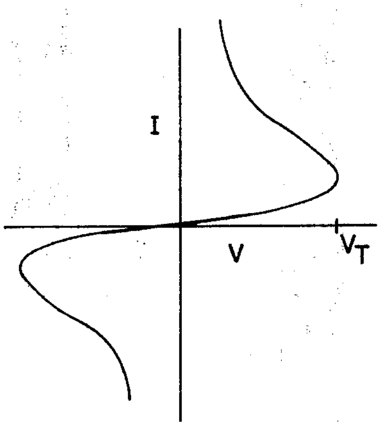
FIG. 2(*a*) is a graphical representation of current controlled negative differential resistance behavior exhibited by an amorphous semiconductor device.
Figure 2B:
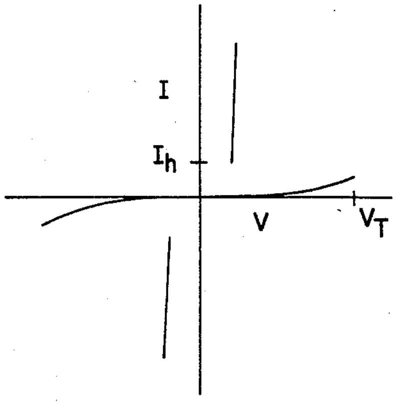

If the device 1 exhibits negative resistance effects, the V-I characteristic would be that shown in FIG. 2(*a*). For a current controlled negative differential resistance (CNDR) behavior, it is seen that all regions of the V-I curve are accessible. For positive currents, these regions are of three types: a generally high resistance region from the origin to the turnover voltage, $V_T$; a region of negative differential resistance; and a region of low resistance. This curve is typically symmetric upon a reversal of the applied current.

If the device 1 exhibits threshold switching (TS) behavior, its V-I characteristic would be that shown in FIG. 2(*b*). For TS all regions of the V-I curve are not accessible. In fact, the V-I characteristic of the device 1 is comprised of regions of two types: a generally high resistance region from the origin to $V_T$ and then an abrupt transition to a low resistance branch of the curve which is not sustained below the current value $I_h$. This curve is also symmetric upon the reversal of the applied current.

Figure 3A:
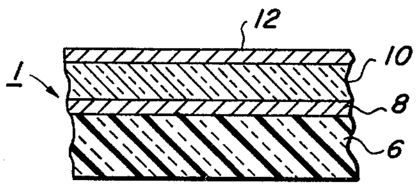
FIGS. 3*a* and 3*b* are cross-sectional views of a semiconductor device having certain geometries which exhibit current controlled negative differential resistance behavior.
Figure 3B:
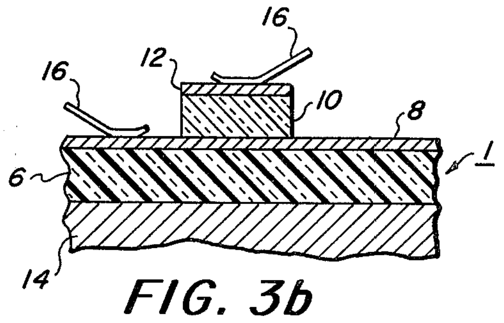

One device configuration which yields CNDR behavior is shown in two stages of fabrication in schematic cross section in FIGS. 3(*a*) and (*b*). In FIG. 3(*a*) the device 1 is comprised of various layers deposited upon a substrate 6 which may be a dielectric or conductive material. For example, the substrate 6 may be made of a smooth sheet of glass or metal. If the substrate 6 is not capable of carrying an electric current, a thin film 8 of conductive material is to be deposited on the surface of the substrate 6. The film 8 may consist of a thin (<1$\mu$m) layer of chromium or aluminum, for example. Next, a layer 10 of semiconducting material is deposited on the conductive film 8.

The semiconducting material may consist of, but is not restricted to, the class of amorphous materials known as chalcogenide glasses. Some examples of these, which have been used in the devices described within this preferred embodiment, are alloys consisting of, by atomic fraction, 40% arsenic, 60% tellurium; 40% arsenic, 40% selenium, 20% tellurium; 40% arsenic, 20% selenium, 40% tellurium; 48% tellurium, 30% arsenic, 12% silicon, 10% germanium; and numerous other alloys which would be chosen for their electrical properties and resistance to crystallization. The semiconductor layer 10 may be of any reasonable thickness and in this preferred embodiment would be on the order of 1 $\mu$m. On the exposed surface of the layer 10 is deposited an additional conductive film 12. A suitable material for the film 12 would be an aluminum layer 0.5 $\mu$m thick. The conductive films 12 and 8 would serve as the electrode media for the device 1.

The methods of deposition employed in the fabrication of the device 1 are techniques well known in the art in the deposition of thin films and photolithography of microelectronic circuits. Additional processing steps need further be utilized to define by geometry whether or not the device 1 will exhibit CNDR or TS behavior. FIG. 3(*b*) shows a CNDR device 1 which results from modifying the conducting film 12 to define a conductive pad of some defined geometry, e.g., a square or circle, by photolithographic and chemical etching techniques. The semiconductor layer 10 is etched to have the same domain and geometry as the conductive film 12. Specifically, the second etching process is accomplished by the use of a selective chemical etch, using the conductive pad as a mask. The substrate 6 may then be bonded to a fixture 14 with an adhesive, usually chosen for good thermal transport properties. Conductive wires 16 are bonded to the conductive films 8 and 12 to effectively use such films as electrodes.

A method for fabricating the device which displays threshold switching effects is to fabricate the device shown in FIG. 3(*a*) of the same or different chemical composition and define a geometry different from that shown in FIG. 3(*b*). A device 1 which would exhibit TS behavior would be that shown in FIG. 4(*a*). Such a device would be obtained by etching the conductive film and the semiconductor layer 10 such that the semiconductor layer 10 has an increased extent beyond the domain defined by the contact area between the film 12 and the layer 10. The remaining process steps for producing a TS device is the same as in the case of fabricating a CNDR device, namely, the substrate 6 is bonded to the fixture 14 and the conductive wires 16 are bonded respectively to the conductive films 8 and 12. Merely the difference in device geometry will result in an amorphous semiconducting device which displays threshold switching behavior, rather than negative resistance effects.

Figure 4A:
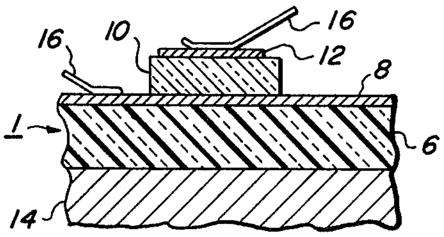
FIGS. 4*a* and 4*b* are cross-sectional views of certain geometries of a semiconductor device which exhibits threshold switching behavior.
Figure 4B:
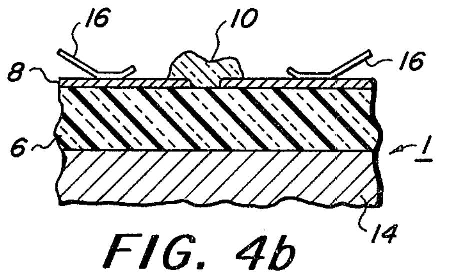

As shown in FIG. 4(*b*), a coplanar geometry may be defined which produces threshold switching behavior. This geometry incorporates only one conductive film 8 which contains a gap which electrically isolates one side of the film from the other. The gap is produced photolithographically to insure that the gap is small (approximately 5$\mu$m). The semiconductor layer 10 is then deposited so as to fill the gap and extend beyond the boundaries defined by the gap. The semiconductor layer 10 is etched from regions exterior to the gap so as to allow electrical contact to be made between the layer 10 and the film 8. The gap may be of uniform width or curved as desired.

CNDR behavior is enhanced for geometries with no semiconductor material extent beyond the boundaries defined by its respective electrodes, while TS behavior is enhanced for geometries with semiconductor material extending greater than a certain discernible extent beyond the boundary defined by the contact surface between one of the electrodes and the material itself. Numerous other geometries than shown in this preferred embodiment may be configured to produce CNDR or TS effects. The critical parameter, then, is the use of geometries to produce the desired effect even though the chemical composition of the devices with differing geometries may be identical. This finding directly controverts the commonly accepted belief that the chemical mechanisms which lead to TS behavior are radically different than those which lead to CNDR effects.

Figure 5:
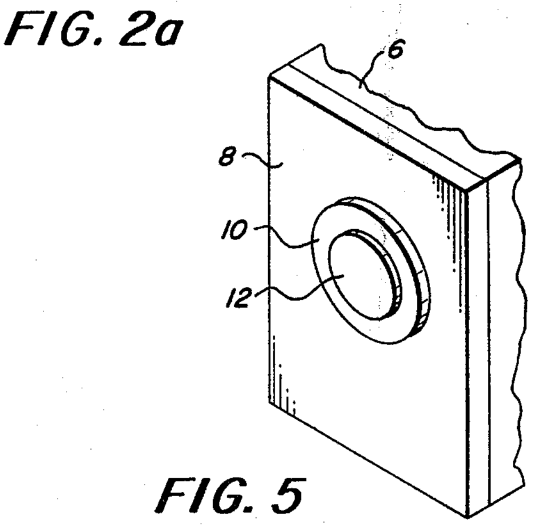
FIG. 5 is a schematic isometric view of a semiconductor device contemplated by the present invention.

The transition and device behavior by virtue of a mere change in geometry may be explained yet within the framework of a single mechanism for both effects. Devices were fabricated on several 25 × 25mm$^2$ Corning 0211 glass substrates 6 (0.018 cm thick) by successive vapor deposition of thin films 8, 10, and 12, respectively of Cr(0.25 $\mu$m), amorphous (a—)$As_2SeTe_2$ (1.21 $\mu$m), and Al(0.5 $\mu$m). The metal films 8 and 12 were deposited in a conventional high vacuum system at $10^{-7}$Torr and the chalcogenide alloy layer 10 was deposited in a flash evaporator at $10^{-7}$ Torr. Subsequent to the growth of the films, all substrates 6 were subjected to photolithographic and chemical etching procedures to define arrays of circular devices. These devices consisted of circular aluminum electrodes 12 of radius *r* centered over chalcogenide discs 10 of radius R>*r*. The Cr film 8 served as the common electrode for all devices in the array and was not etched. A schematic view of a completed device as described is shown in FIG. 5. For all devices, $r = 1.9 \times 10^{-2}$cm. These devices constituted an array A composed of a plurality of devices having geometries similar to that shown in FIG. 4(*a*).

An array B of these devices was fabricated from the array A by the additional step of using the aluminum circular film 12 as a mask for etching the chalcogenide layer 10 such that *r* = R for all the devices in this latter array B. Completed device arrays were scribed into 0.1 inch squares and mounted on TO-101 header fixtures 14 with a thermally conductive epoxy. Al wires were ultrasonically bonded to the header leads and the individual devices. All measurements were made at 24°C.

The array B devices ($r = R$) showed stable CNDR behavior with turnover occurring at ~24 V and ~1 mA. As the bias was increased into the negative resistance region, hysteresis of the V-I trace was evident. Increasing the device current to 7 mA resulted in no significant changes in the V-I characteristic, although such high currents result in enhanced crystallization kinetics and hence early failure of the device.

The properties of the array A devices were initially quite similar to those of array B devices in that a region of CNDR was initially observed upon increasing the bias. Once into the negative resistance regime, however, the V-I characteristic spontaneously changed from CNDR to TS behavior. An attempt was made to correlate the current at which this transition takes place with the extent of chalcogenide overlap in relation to the Al film 12; however, the data showed much scatter and no clear dependence on the ratio $R/r$. Transition currents typically ranged from 1 to 5 mA. With respect to each of the arrays, $V_T$ was identical, independent of which effect was observed.

The difference in V-I characteristics between the two arrays may be explained in terms of heating characteristics. One dimensional heat flow and CNDR behavior may be favored for the array B devices by virtue of the fact that the geometry of such devices places all the chalcogenide glass within a uniform electric field (all the chalcogenide glass is within the boundaries defined by the outer periphery of the respective conductive films 8 and 12). One characteristic of systems displaying CNDR is the possibility of current filamentation. This phenomenon results when a device is biased into the CNDR regime and one region of the semiconducting layer may carry an increased current density over that carried in neighboring areas. This increase in current density will result in a reduction in device voltage, and hence reduce current density in other areas of the device. At steady-state, most of the device current is being carried by a small high-current density filament, which need not be structurally different from the surrounding material. Filament formation need not take place if the boundary conditions of the system do not favor it, as is the case with array B devices.

Filament formation, however, may occur in array A devices, exhibiting TS behavior, since radial as well as axial heat flow can occur in the chalcogenide glass layer. Furthermore, large fringing fields will be present at the point at which the chalcogenide material crosses under the Al electrode 12. Such high field points could readily serve as nucleation sites for a current filament. It has been shown by A. C. Warren, Journal of Non-Crystalline Solids, 4, and others subsequently that models which lead to current filamention also lead to TS behavior.

$<g>$, the average rate of production of Gibbs free energy per unit volume of the chalcogenide glass, may be calculated for the case of filamentry and nonfilamentry conduction, respectively. It has been found that a geometry chosen, such as that shown in FIG. 4, which favors filament formation produces a lower Gibbs free energy where $V > V_T$, since the resulting filamentation would sharply increase entropy production. The difference between $<g>$ for filamentry and non-filamentry conduction may be the driving force for the transition from CNDR to TS behavior.

Obviously, many different geometries and process techniques other than those taught herein are possible in the light of this teaching. It is therefore to be understood that, in the scope of the appended claims, the invention may be practiced other than as specifically described.

What is claimed is:

1. An array including at least first and second solid state elements, said first solid state element including a first body of semiconductive glass and at least two spaced electrodes in contact with said first body of glass, said first body being co-extensive with a boundary defined by the contact loci between said first body of glass and said electrodes, such that said first solid state element exhibits a voltage-current characteristic having negative differential resistance behavior consisting of a generally high resistance region below a turnover voltage, a region of negative differential resistance, and a region of low resistance, said second solid state element including a second body of semiconductive glass, and at least two spaced electrodes in contact with said second body of glass, said second body extending beyond the boundary defined by the contact loci between said second body of glass and at least one of the electrodes in contact with said second body, such that said second solid state element exhibits a voltage-current characteristic having threshold switching behavior consisting of a generally high resistance region below a turnover voltage and an abrupt transition to a low resistance region which is not sustained below a certain current value, said first and second solid state elements being formed on a common supporting substrate, and said first and second bodies of semiconducting glass having similar compositions.

2. The array of claim 1, wherein the composition of said bodies of semiconducting glass is a glass from the class of chalcogenide glasses.

3. The element of claim 2 wherein the glass is from the binary group arsenic-tellurium.

4. The element of claim 3 wherein the glass has a composition by atomic fraction comprising 40% arsenic and 60% tellurium.

5. The element of claim 2 wherein said body of glass is from the ternary group arsenic-selenium-tellurium.

6. The element of claim 5 wherein the glass has a composition by atomic fraction comprising 40% arsenic, 40% selenium, and 20% tellurium.

7. The element of claim 5 wherein the glass has a composition by atomic fraction comprising 40% arsenic, 20% selenium, and 40% tellurium.

8. The element of claim 2 wherein said body of glass is from the quarternary group arsenic-tellurium-silicon-germanium.

9. The element of claim 8 wherein the glass has a composition by atomic fraction comprising 30% arsenic, 48% tellurium, 12% silicon, and 10% germanium.

* * * * *